United States Patent [19]
Puar

[11] Patent Number: 4,508,980
[45] Date of Patent: Apr. 2, 1985

[54] SENSE AND REFRESH AMPLIFIER CIRCUIT

[75] Inventor: Deepraj S. Puar, San Jose, Calif.

[73] Assignee: Signetics Corporation, Sunnyvale, Calif.

[21] Appl. No.: 575,724

[22] Filed: Feb. 1, 1984

Related U.S. Application Data

[63] Continuation of Ser. No. 740,963, Nov. 11, 1976, abandoned.

[51] Int. Cl.³ .................. H03K 5/24; H03K 3/356; G11C 7/06
[52] U.S. Cl. ................................. 307/530; 307/279; 365/203; 365/205
[58] Field of Search ............ 307/355, 362, 530, 356, 307/362, 363, 279; 365/205, 203, 207, 208

[56] References Cited

U.S. PATENT DOCUMENTS

| | | | |
|---|---|---|---|
| 3,838,295 | 9/1974 | Lindell | 307/238 |
| 3,882,326 | 5/1975 | Kruggel | 307/355 X |
| 3,959,781 | 5/1976 | Mehta et al. | 307/DIG. 3 X |
| 3,978,459 | 8/1976 | Koo | 307/238 X |
| 3,992,637 | 11/1976 | Cassidy | 307/DIG. 3 X |
| 4,000,413 | 12/1976 | Wong et al. | 307/DIG. 3 X |
| 4,001,601 | 1/1977 | Schuster | 307/DIG. 4 X |
| 4,010,388 | 3/1977 | Alvarez, Jr. | 307/279 |
| 4,021,788 | 5/1977 | Marr | 307/238 X |
| 4,081,701 | 3/1978 | White, Jr. et al. | 307/355 |

OTHER PUBLICATIONS

Chu et al., "Low-Power, High-Speed Sense Latch"; IBM Tech. Discl. Bull.; vol. 17; No. 9, pp. 2582–2583; 2/1975.

Jacobson et al., "Memory Bit Driver"; IBM Tech. Discl. Bull.; vol. 15, No. 6, pp. 1734–1735; 11/1972.

Arzubi, "Sense Amplifier for Capacitive Storage"; IBM Tech. Discl. Bull.; vol. 19, No. 2, pp. 407–408; 7/1976.

Barsuhn et al.; "Semiconductor Storage Circuit Utilizing Two Device Memory Cells"; IBM Tech. Discl. Bull.; vol. 18, No. 3, pp. 786–787; 8/1975.

Primary Examiner—Larry N. Anagnos
Attorney, Agent, or Firm—Robert T. Mayer; Steven R. Biren

[57] ABSTRACT

An amplifier circuit for sensing and refreshing stored information, utilized with a voltage supply. The amplifier is of the type that is capable of assuming first and second conditions in response to signals at first and second input nodes. The circuit comprises first and second cross coupled devices each capable of assuming a high and low conduction state. Restore circuitry means is provided connected between the active devices and the voltage supply for selectively connecting the supply solely to the device assuming a low conduction state. In a dynamic random access memory embodiment means is further provided for alternately precharging the nodes to a predetermined state and applying stored information to the nodes to cause the amplifier to assume first and second conditions in response to stored information.

5 Claims, 3 Drawing Figures

SENSE AND REFRESH AMPLIFIER CIRCUIT

This is a continuation of application Ser. No. 740,963, filed Nov. 11, 1976, now abandoned.

BACKGROUND OF THE INVENTION

Sense and refresh circuits have long been known in the art. Optimization of the circuits for operation has been disclosed in "Optimization of the Latching Pulse for Dynamic Flip Flop Sensors" by W. T. Lynch and H. J. Boll, IEEE Journal of Sold State Circuits; Vol. SC-9 and "Storage Array and Sense/Refresh Circuit for Single Transistor Memory Cells" by K. U. Stein, A. Sihling and E. Doering, IEEE JSSC, Vol. SC-7, Oct. '72.

However, sense and refresh circuits have long suffered from excessive power consumption and design constraints. Thus there is a need for a sense and refresh circuit having low power consumption and improved design for use in high density integrated circuits.

OBJECTS AND SUMMARY OF THE INVENTION

Accordingly, it is the general object of the present invention to provide an improved sense and refresh amplifier circuit for sensing stored information.

It is the particular object of the present invention to provide an improved sense and refresh amplifier circuit having greatly reduced power consumption and which occupies greatly reduced semiconductor area.

The foregoing and other objects of the invention are achieved in an amplifier circuit, for sensing stored information, utilized with a voltage supply. The amplifier is of the type that is capable of assuming first and second conditions in response to signals at first and second input nodes. The amplifier circuit comprises first and second cross coupled active devices with respective input nodes with each device being capable of assuming a high and a low conduction state. Restore circuitry means is provided connected between the active devices and the voltage supply for selectively connecting the supply solely to the device assuming a low conduction state. Further, in a random access memory embodiment means is provided for alternately precharging said nodes to a predetermined state and applying stored information to the input nodes to cause the amplifier to assume first and second conditions in response to stored information.

DESCRIPTION OF THE REFERRED EMBODIMENTS

Figure 1:
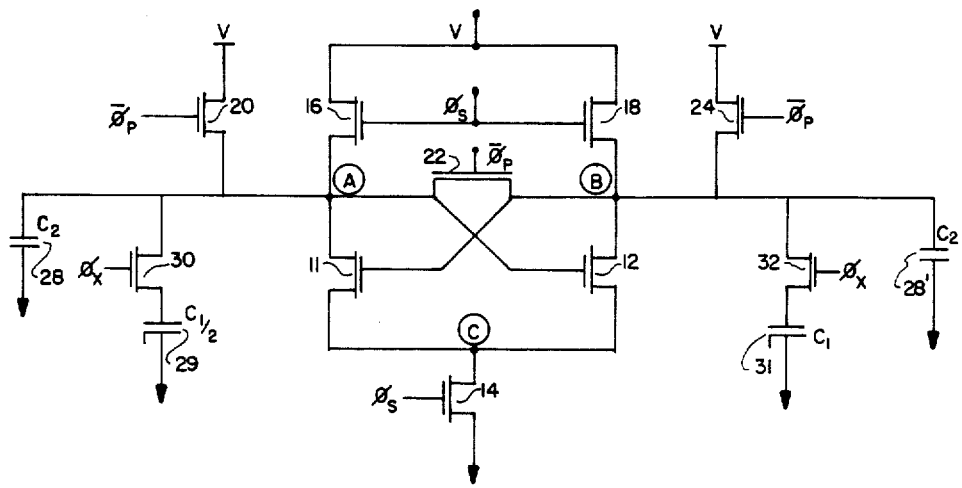
FIG. 1 is a schematic diagram showing a sense and refresh circuit as is known in the prior art.

Referring to FIG. 1, a prior art sense and refresh amplifier of the type conventionally used in dynamic random access memories is shown. In brief, and so that the present invention may be more readily appreciated, the conventional circuit may include cross coupled MOS devices 11 and 12 having respective gate elements tied to first and second input nodes A and B with common electrodes connected to a node C. Node C is selectively connected to ground by device 14 when a clock signal $\phi_r$ is applied to the gate of device 14. Additional devices 16 and 18 are utilized as active loads and are connected between the voltage supply and nodes A and B respectively. Devices 16 and 18 are also controlled by clock signal $\phi_s$. Devices 20, 22 and 24 are utilized for precharging the circuit. Bit lines extend from nodes A and B, in a physical circuit to exhibit respective parasitic capacitances 28 and 28' representative of the actual circuit distributed capacity.

When single transistor, single capacitor stored information cells are accessed, particular storage locations represented by devices 30 and 32 are connected to the bit lines. When $\phi_x$ is energized the storage capacitors C1/2 and C1, which may be of the variable MOS type, are connected to the respective amplifier nodes. The differences in the capacitors C1 and C1/2 provide a differential voltage at the nodes when the signal $\phi_x$ is enabled. Next when signal $\phi_r$ is enabled the differential voltage is amplified and the amplifier latches in a stable state wherein one of the nodes is high and the other node is discharged toward ground potential. However, as is discussed in the first above cited reference, the shape and fall time of the node C critically determines how much charge is removed from whichever node A or B stays high and thus results in a voltage drop on the precharged node which, by design, was to remain in a charged or high condition.

Transistors 16 and 18 are provided to restore the charge with the voltage drop and time required for restoration dependent on the effective resistance of the transistor. A low resistance transistor 16 or 18 more quickly restores the charge but, since the transistors are of like construction and geometry, results in increased direct current in the node that goes low. In turn the devices consume excessive power which must be dissipated in a physical circuit structure. That is, there are tradeoffs in the use of the devices 16 and 18, a low resistance device being desirable for restoring charge to a high or off side, but at the same time the same low resistance transistor providing excessive current dissipation when that side assumes a low state.

By way of operative example if node A goes low and node B stays high then a current path is provided from voltage supply V to ground via transistors 16, 11 and 14. On the other hand if node B goes low and A stays high then the high current path is via transistors 18, 12 and 14. This current path does not contribute to needed operation and is wasteful. The node to be restored need only be provided with a transient current just sufficient in magnitude to restore the voltage drop on the node staying high. Moreover the effective series resistance of transistors 11 and 14, in practice, when node A is low, must be of a resistance many times lower than that of transistor 16 to maintain a voltage level at node A that approximates ground potential. Thus it can be seen at best that the prior art circuitry for the proper operation provides wasteful power consumption and thus correspondingly limits the density of a circuit structure.

Figure 2:
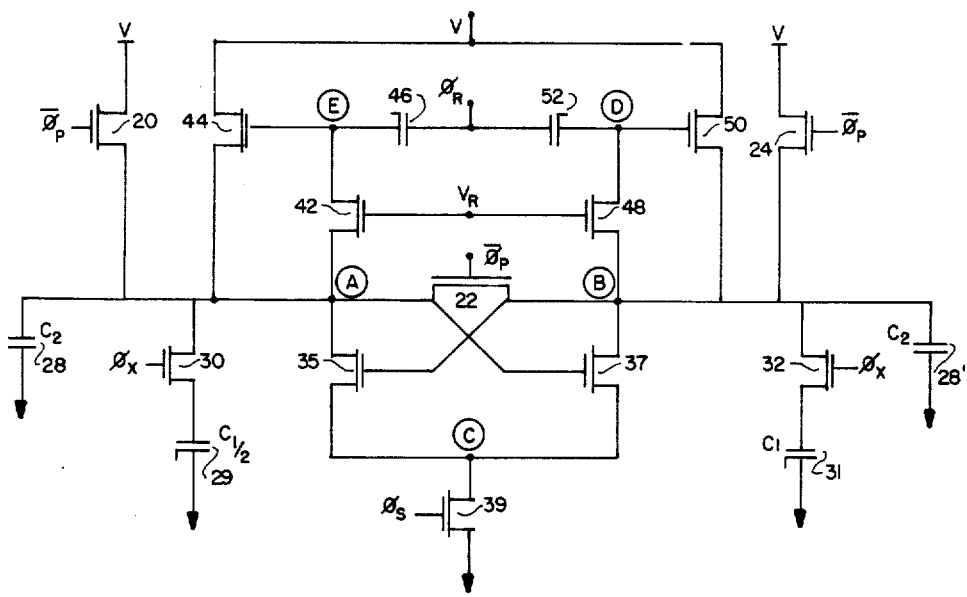
FIG. 2 is a schematic diagram of a sense and refresh amplifier in accord with the present invention.

Referring now to FIG. 2, the sense and refresh amplifier circuit incorporating the features of the present invention is shown. First and second cross coupled devices 35 and 37 are provided having the respective source or common terminals connected to node C. The drain terminals of devices 35 and 37 are connected respectively to nodes A and B with the gate electrode of device 37 connected to node A and the gate electrode of device 35 connected to node B. An additional device 39 is provided connected between the node C and a ground or common terminal, with the control gate of the device further connected to be enabled by an external clock signal $\phi_s$. Devices 35, 37 and 39 may be optimally designed to perform switching operations and need not have the further restraint of carrying a given amount of current as was required of the analogous devices 11, 12 and 14 of the prior art. An additional device 22 has its source and drain elements connected between nodes A and B with the gate element connected to be enabled by gate signal $\phi_p$.

The sense and refresh amplifier circuit further includes transistor 42 connected between node A and node E and having a control gate connected to a $V_R$ signal terminal. A further transistor 44 is connected between node A and the voltage supply V and has a control element connected to node E. A variable MOS capacitor 46 is connected between node E and an additional clock signal terminal $\phi_R$. In symmetrical manner transistor 48 is provided connected between node B and node D and has a control gate connected to terminal $V_r$. An additional device 50 is provided connected between node B and voltage supply means V and has a control electrode connected to node D. A variable MOS capacitor 52 is provided connected between node D and clock signal $\phi_R$. Although variable MOS capacitors are shown, it is to be understood that conventional capacitors may likewise be used.

Figure 3:
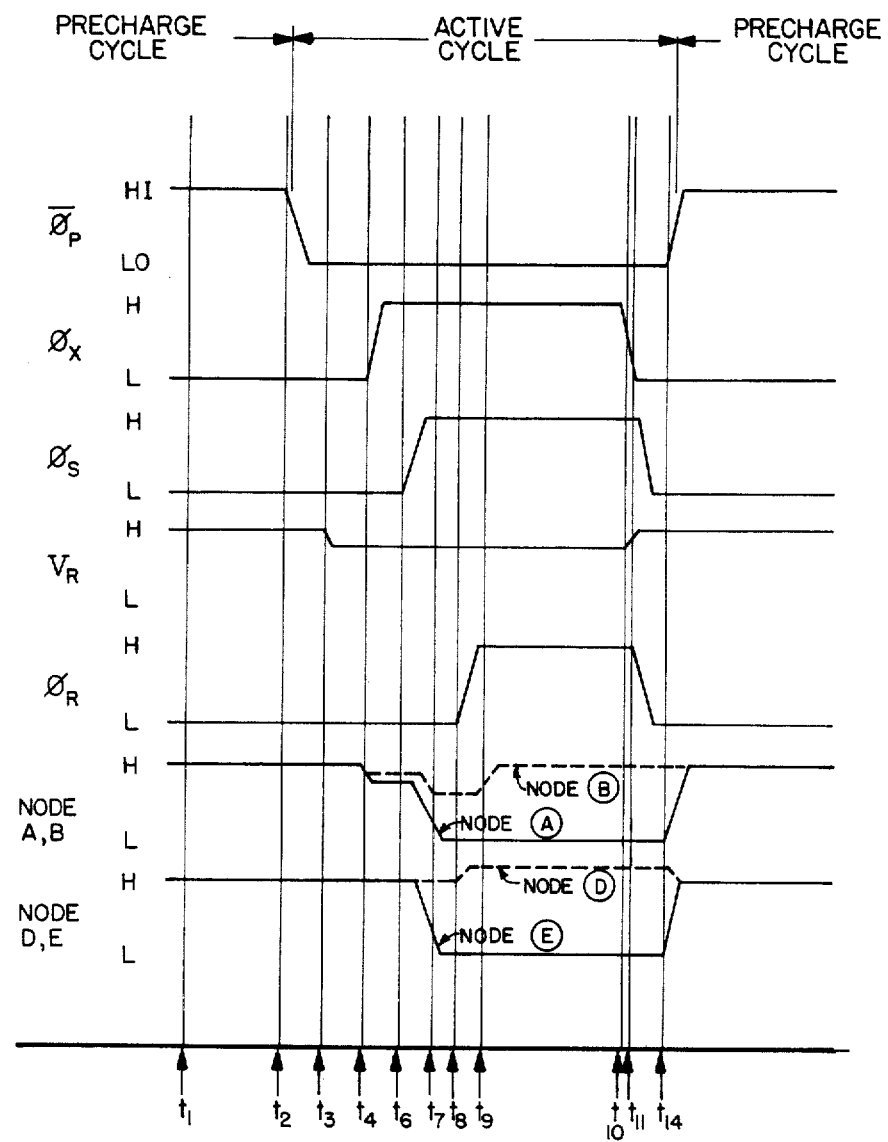
FIG. 3 is a timing diagram showing the operational sequence of the FIG. 2 invention.

Turning then to the timing diagram FIG. 3, the operation of the FIG. 2 circuit may now be observed. At t1 the nodes A and B are precharged to a high level with $\phi_p$ high via transistors 20 and 24. Further nodes A and B are at equal potential by virtue of transistor 22. At time t2 the precharge clock signal $\phi_p$ goes to an off or low state. At time t3 voltage $V_R$ precharged to a high value is lowered by a magnitude that is more than the maximum voltage drop expected on the eventual off side node (the node A or B that remains high) during the subsequent latchup when signal $\phi_s$ is energized. The magnitude of voltage $V_R$ should not be lowered to less than one threshold voltage above ground potential and should preferably be positioned near the relatively high end of its range in order to optimize speed characteristics. At some predetermined time later at time t4 the $\phi_x$ clock goes high. Devices 30 and 32 thus conduct and charge sharing occurs on respective nodes A and B. At node A storage cell capacitor 29 shares charge with parasitic capacitor 28. At node B capacitor 31 shares charge with parasitic capacitor 28'. Capacitors 29 and 31, as before, provide ratios of C1/2 and C1 respectively. As a result, a differential voltage having a magnitude of approximately 200 to 400 milivolts is provided between node A and node B. If capacitor 31 had a relatively high voltage stored there across, then node B will be at a higher potential than node A and vice versa.

Next at t6, $\phi_s$ goes high, transistor 39 begins to conduct and the amplifier circuit latches in a condition predetermined by the differential voltage polarity that exists between nodes A and B. At the same time the shape of the falling edge of the wave form at node C determines the amount of charge lost from the off side node during latchup. The first mentioned above cited reference describes this phenomena. If the charge lost is not restored before the circuit goes back into the precharge portion of the cycle a poorer or deteriorated high level is refreshed onto capacitor 31 since node B is now the illustrated off side node of FIG. 3.

In this case node A discharges to full ground potential through transistors 35 and 39 and causes node E to discharge to ground through transistor 42. This in turn causes switched capacitor 46 to assume a low capacity state. Node B, even with a voltage drop, stays sufficiently high to maintain transistor 48 in an off state because of the lowered voltage on $V_R$, and node D will remain at a high precharged value. Next at time t8, when the $\phi_R$ goes high, the capacity coupling through capacitor 52 causes the node D potential to further increase and causes transistor 50 to assume the triode region of conduction. The triode region is that conduction between the completely on or saturated, and completely off states. The result is a charge restoration at node B to its absolute maximum voltage by a transient current supplied via transistor 50. On the node A side, since node E was discharged to ground, the $\phi_R$ clock has no coupling effect and transistor 44 remains off. The result is no direct current flows from the source potential V to ground. A ground potential then results at node A and provides an absolute minimum voltage storage in the storage cell connected to the node A bit line. At time t10, $\phi_x$ falls, at t11 $\phi_s$ and $\phi_R$ fall and at time t14 the $\phi_p$ signal is again provided for the precharge cycle.

Thus, it is apparent that an improved sense and refresh amplifier circuit has been provided. In particular, the circuit has restore circuitry means for selectively connecting the supply solely to the device assuming a low conduction state and in eliminating a path for high DC current to flow for the device in a high conduction state. Further, the effective size of the respective transistors in the circuit can be chosen to be as low or as high as desirable without constraints as to the low voltage at the on side node, power dissipation or the effective series resistance of the transistor as is presently known.

I claim:

1. In an amplifier circuit for sensing stored information, utilized with a voltage supply, the amplifier of the type that is capable of assuming first and second conditions in response to signals at first and second input nodes, the circuit comprising, first and second cross coupled active devices with respective input nodes, each device being capable of assuming a high and a low conduction state, restore circuitry means connected solely between said active device input nodes and the voltage supply for selectively connecting the supply solely to the device assuming a low conduction state, said restore circuitry connected to the cross coupled devices including third, fourth, fifth and sisth active devices having control, common and output elements and first and second coupling means, the third and fourth device common elements together connected to a first input node, the fifth and sixth device common elements together connected to a second input node, the output element of the third connected to the control element of the fourth and the output element of the fifth connected to the control element of the sixth, the output of the fourth and sixth devices connected to the voltage supply, the control element of the third and fifth connected to an additional voltage supply, the first coupling means connected for coupling control signals to the control element of the fourth device, and the second coupling means connected for coupling control signals to the control element of the sixth device, and means for alternately precharging said nodes to a predetermined state and applying stored information to the input nodes to cause the amplifier to assume first and second conditions in response to said stored information.

2. A circuit as in claim 1 wherein said first, second, third, fourth, fifth and sixth devices are field effect transistors and said first and second coupling means is a coupling capacitor.

3. A circuit as in claim 2 wherein said additional supply has a value or not less than one field effect transistor threshold magnitude from ground potential.

4. A circuit as in claim 2 wherein said coupling capacitor is an MOS variable capacitor.

5. In an amplifier circuit for sensing stored information, utilized with a voltage supply, the amplifier of the type that is capable of assuming first and second conditions in response to signals at first and second input nodes, the circuit comprising, first and second cross coupled active devices coupled to said first and second input nodes, each device being capable of assuming a high and a low conduction state, restore circuitry means connected between said device input nodes and the voltage supply for selectively connecting the supply solely to the device assuming a low conduction state, said restore circuitry means comprising third and fourth active devices having control electrode means coupled to said first and second input nodes through fifth and sixth active devices, respectively, said fifth and sixth active devices being alternately in a low and a high conduction state in correspondence with the low and high conduction state of said first and second active devices and capacitive means for supplying a restoring voltage to said control electrodes of said third and fourth active devices.

* * * * *

UNITED STATES PATENT AND TRADEMARK OFFICE
CERTIFICATE OF CORRECTION

PATENT NO. : 4,508,980
DATED : April 2, 1985
INVENTOR(S) : DEEPRAJ S. PUAR

It is certified that error appears in the above-identified patent and that said Letters Patent is hereby corrected as shown below:

IN THE CLAIMS:

Claim 3, line 2, change "or" to --of--.

Signed and Sealed this

Twentieth Day of January, 1987

Attest:

DONALD J. QUIGG

Attesting Officer

Commissioner of Patents and Trademarks